United States Patent [19]

Salvi, Jr.

[11] Patent Number: 5,566,055

[45] Date of Patent: Oct. 15, 1996

[54] SHIELED ENCLOSURE FOR ELECTRONICS

[75] Inventor: Joseph A. Salvi, Jr., Huntington Beach, Calif.

[73] Assignee: Parker-Hannifin Corporation, Cleveland, Ohio

[21] Appl. No.: 398,476

[22] Filed: Mar. 3, 1995

[51] Int. Cl.$^6$ ...................................................... H05K 9/00
[52] U.S. Cl. ........................ 361/816; 361/796; 361/810; 361/818; 174/35 R
[58] Field of Search ..................................... 361/816, 818, 361/810, 752, 796, 761; 174/35 R, 35 MS, 35 TS; 439/108, 109; 333/246, 247, 243, 244

[56] References Cited

U.S. PATENT DOCUMENTS

| | | |
|---|---|---|
| 4,227,037 | 10/1980 | Layton . |
| 4,435,565 | 3/1984 | Ebneth et al. . |
| 4,545,926 | 10/1985 | Fouts, Jr. et al. . |
| 4,678,699 | 7/1987 | Kritchevsky et al. . |
| 4,777,565 | 10/1988 | McIntosh . |
| 4,780,575 | 10/1988 | Flavin et al. . |
| 5,160,807 | 11/1992 | Fry et al. ................................ 174/35 R |
| 5,166,864 | 11/1992 | Chitwood et al. ....................... 361/386 |
| 5,185,654 | 2/1993 | Mosher et al. . |
| 5,260,513 | 11/1993 | Giles et al. . |
| 5,326,414 | 7/1994 | Mosher et al. . |

*Primary Examiner*—Leo P. Picard
*Assistant Examiner*—Y. Whang
*Attorney, Agent, or Firm*—Christopher H. Hunter; John A. Molnar, Jr.

[57] ABSTRACT

An EMI/RFI shielded cover plate assembly for an electronics enclosure includes a cover plate having a major surface area with outwardly-projecting walls or flanges defining interface locations with the underlying enclosure. A shielding compound is provided across the entire cover plate including the walls or flanges. The shielding compound is disposed in a relatively thin layer across the major surface area of the cover plate for EMI/RFI shielding, and in a thicker layer at the interface locations to provide a gasket-like response for environmentally sealing the cover plate assembly to the underlying enclosure and for thermal transfer and electrical continuity. The shielding compound can be compression molded with the cover plate. The shielded cover plate assembly provides a simple and economical method for providing a EMI/RFI shield and a gasket from a single shielding compound.

20 Claims, 4 Drawing Sheets

SHIELED ENCLOSURE FOR ELECTRONICS

FIELD OF THE INVENTION

The present invention relates generally to EMI and RFI shielded housings and enclosures for electronics, and more particularly to a shielded cover plate assembly for an electronics enclosure.

BACKGROUND OF THE INVENTION

Housing and enclosures for storing and protecting electronics and electronic products are well known. In some applications, and in particular with more powerful and compact electronics, the electronic enclosures must shield the electronics or electronic products from electromagnetic interference (EMI) and/or radio frequency interference (RFI), prevent significant amounts of EMI or RFI from radiating from the enclosure, and/or provide internal circuit-to-circuit shielding. The enclosures are also typically environmentally sealed around the periphery and can provide thermal transfer from the electronic product to the surrounding ambient or between circuit-to-circuit.

In the past, electronic enclosures have been formed from metal to meet emissions and radiated noise requirements. The metal enclosures, however, have certain disadvantages in being costly and weighty, are limited in design and manufacturing possibilities, and can have issues with respect to deflection, humidity and expansion over a broad temperature range.

As such, plastic (such as thermoplastic) enclosures have received acceptance in the market place as meeting certain of the needs of electronic product manufacturers. However, these enclosures, being non-conductive, require some sort of shielding to meet emissions and radiated noise requirements. Typical shielding technologies for plastic enclosures have included coatings of copper, silver or nickel; vacuum metallization; and plating-on-plastics, among others. The coatings are applied across the major surface portions of the enclosures. Examples of this kind of technology are shown in U.S. Pat. Nos. 4,227,037; 4,435,465; 4,777,565 and 5,311,408.

Another shielding technology has included applying a shielding assembly to the inside surface of the enclosure. The shielding assembly comprises a pair of porous non-woven layers, one of which consists of uniform fibers of a solder-like metal alloy with a low melting temperature, and the other which consists of an EVA polymer that functions as a hot melt adhesive. The adhesive side of the assembly is located against the inside surface of the enclosure. Upon heating, the shielding assembly becomes a fused metal coating with the enclosure. This technology is available from the 3M Corporation.

At the interface locations between a cover and the underlying enclosure or between the cover and the electronic product, it is necessary to have a resilient type of shielding material. A resilient type of shielding material enables the cover to be repeatably removed and replaced on the enclosure while maintaining constant and maximum area of contact for shield continuity, environmental sealing and/or thermal transfer. The coatings, metallizations and plating-on-plastics can have certain limitations for these locations. Specifically, these technologies can be too thin and not resilient (conformable) enough to provide an appropriate gasket-like response at the interface locations. The shielding assembly with the EVA polymer and metal alloy also suffers from these limitations. As such, at the interface locations, a separate resilient type of conductive gasket has typically been used. One type of gasket material appropriate for the interface locations is available from the Chomerics Division of Parker-Hannifin Corporation under the trademark CHO-SEAL. Such gasket material technology is also shown in U.S. Pat. Nos. 4,545,926 and 4,780,575.

While the combination of the technologies described above has been used to provide an overall shielding solution for electronic enclosures, the combination of the two technologies requires separate compounds for the gasket and the major surface portions of the enclosure. Using separate compounds, however, can increase material costs. The technologies also require separate manufacturing steps, which increases labor costs and manufacturing complexity. Further, the coatings, metallization or plating for the cover and/or gasket must sometimes be applied by an outside vendor, which further can increase the overall cost of the enclosure.

As such, it is believed that there is a demand in the industry for a single shielding solution which provides i) an effective EMI/RFI shield across the entire cover plate and between internal chambers for circuit-to-circuit shielding, and ii) a gasket-type resiliency at the interface locations between the cover plate and the electronics enclosure or the electronic product for environmental sealing, thermal transfer and shield continuity. It is desirable that the shielding solution be easy to apply, and reduce manufacturing complexities and costs.

SUMMARY OF THE INVENTION

The present invention provides a novel and unique shielding solution for electronics enclosures. The shielding solution provides a single shielding compound across the major surface portion of a cover plate as well as along the interface locations. The shielding compound provides EMI/RFI shielding for the electronic products as well as gasket-like resiliency at the interlace locations for sealing, thermal transfer and electrical continuity.

According to a preferred form of the present invention, the shielding compound preferably comprises an elastomer with suspended conductive particles which provides high shielding effectiveness across a wide range of frequencies when applied in just a thin layer. The shielding compound also preferably has resilient, gasket-like properties. Preferably the shielding compound is an appropriate stable, low water absorbing, and low-shrink elastomer with suspended conductive particles. Most preferably, the shielding compound is a nickel-coated graphite-filled silicon elastomer.

The cover plate for the assembly is formed from a plastic material, for example polyester, in any desirable shape depending upon the particular enclosure requirements. The cover plate typically has a substantially planar major surface portion and can have walls or flanges extending outwardly from the planar surface. The walls are located around the periphery of the cover plate and define peripheral interface locations with the enclosure. The walls can also be located along the interior of the enclosure to define internal interface locations. The internal walls can extend out to the electronic product in the enclosure, for example out to a circuit board and form internal chambers, or can extend out only a portion of the distance. The shielding compound is preferably applied in a relatively thin layer across the major surface portions of the cover plate, and in a relatively thicker layer along the distal edges of the walls where the walls contact the enclosure or the electronic product.

The shielding compound prevents EMI/RFI radiation and emissions through the cover plate and between the internal chambers, and provides a resilient gasket-like response at the peripheral and internal interface locations for environmental sealing, thermal transfer and shield continuity. The resiliency of the compound provides a compressive preload against the underlying enclosure at the peripheral interface locations, or against the electronic product, e.g., a circuit board, at the internal interface locations, without compromising the integrity of the seal or significantly deforming the electronic product. The cover plate can thereby be repeatably secured to and removed from the enclosure or the electronic product without compromising the EMI/RFI shield or other features provided by the present invention.

The cover plate for the enclosure can be molded using conventional plastic-forming techniques. The walls extending outwardly from the cover plate are preferably formed in one piece with the cover plate. The shielding compound is then applied to the cover plate using conventional techniques, for example compression or injection molding. If the shielding compound is molded to the cover plate, a bonding agent is preferably initially applied to the cover plate. The cover plate is then located between a pair of molding plates and the shielding compound is introduced between the cover plate and one of the molding plates. The molding plates have channels or grooves which correspond to the walls on the cover plate. The molding plates are then heated under pressure and a vacuum is applied between the plates. The molten shielding compound flows between the plates and into the channels to cover the major surface portion of the plate, as well as the walls. The channels in the mold plates provide for a thicker layer of compound along the distal edges of the walls, or at other interface locations, while a thinner layer of material is applied across the major surface portion of the cover plate.

When the molding plates are removed and the cover plate assembly is allowed to cool, the assembly provides EMI/RFI shielding across the entire cover plate and between the internal chambers, as well as a resilient, gasket-like response at the interface locations for environ:mental sealing, thermal transfer and shield continuity. The shielding solution is provided using a single shielding compound which is easy to apply while reducing manufacturing complexity and costs.

Other features and advantages of the present invention will become further apparent upon reviewing the following detailed description and accompanying drawings.

DETAILED DESCRIPTION OF THE PREFERRED EMBODIMENT

Figure 1:
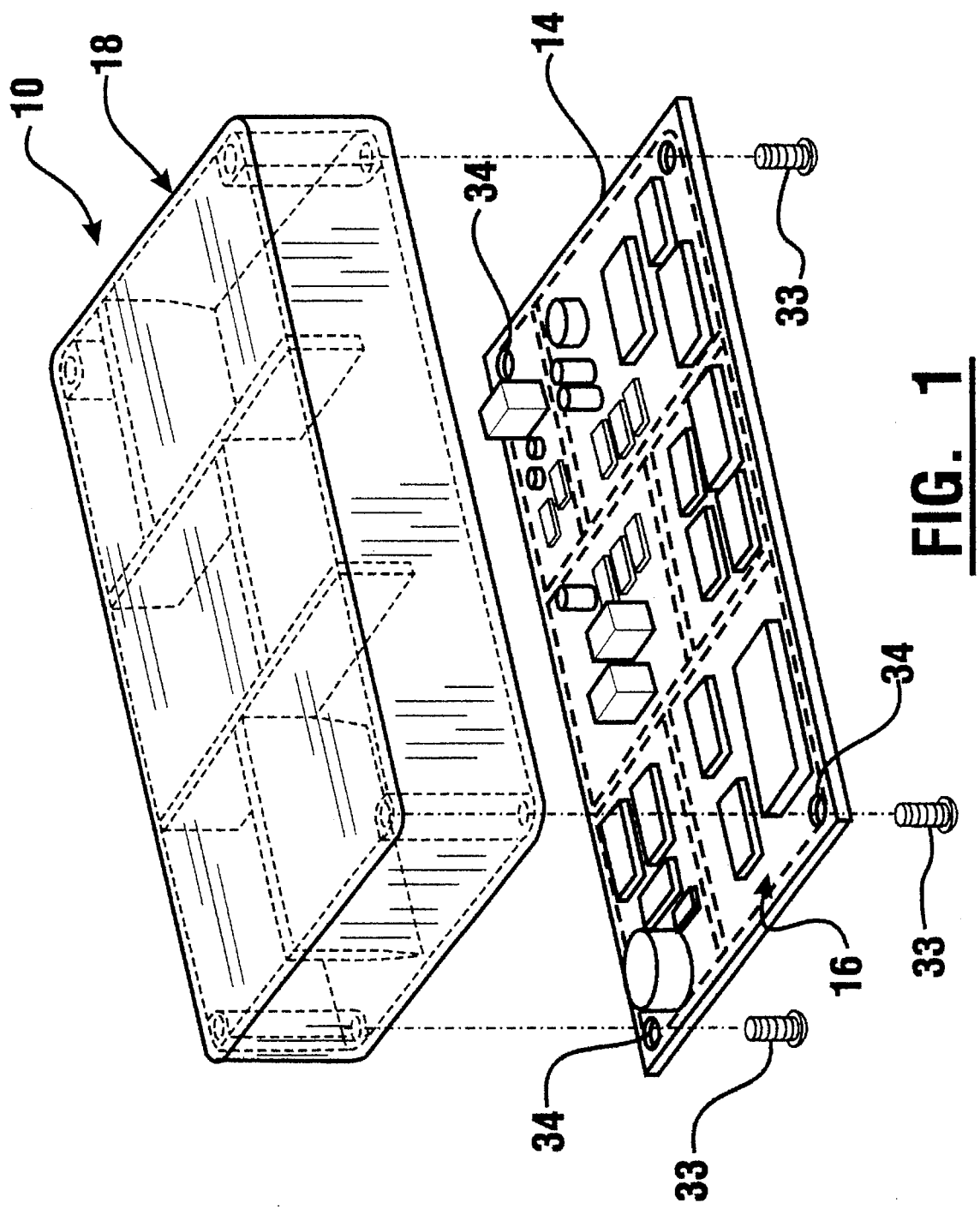
FIG. 1 is a perspective, unassembled view of an electronics enclosure with a cover plate assembly constructed according to the principles of the present invention.

Referring to the drawings, and initially to FIG. 1, an electronic enclosure constructed according to the principles of the present invention is indicated generally at 10. The enclosure includes an electronic product 14, for example a circuit board with circuitry, indicated generally at 16, disposed thereon, and an upper cover plate assembly 18. The cover plate assembly 18 is designed to provide EMI/RFI shielding, environmental sealing, thermal transfer and shield continuity for the electronic product, as will be described herein in more detail. While the cover plate assembly is illustrated as being mounted directly to the electronic product, it is noted that the cover plate assembly could also be mounted to a separate housing portion to entirely surround the electronic product.

Figure 2:
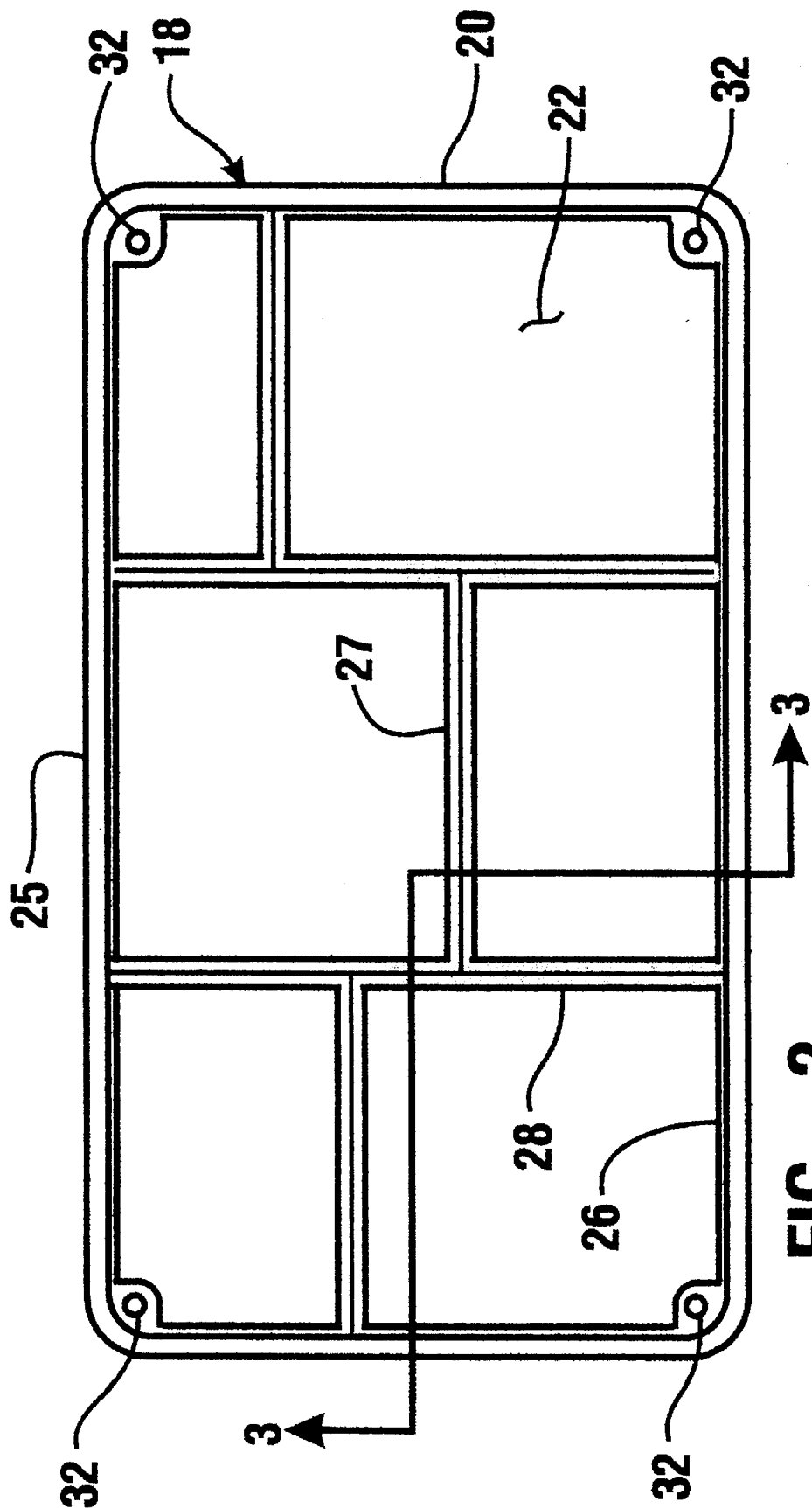
FIG. 2 is a bottom plan view of the cover plate assembly of FIG. 1.
Figure 3:
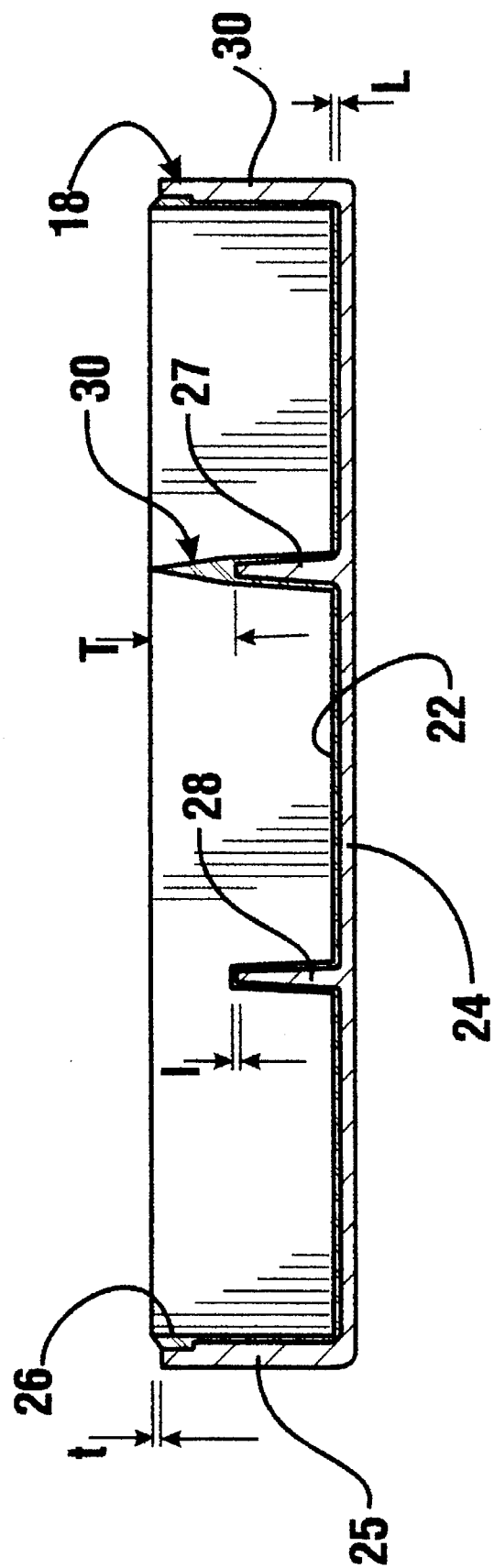
FIG. 3 is a cross-sectional side view of the cover plate assembly taken substantially along the plane described by the lines 3—3 of FIG. 2.

As shown in FIGS. 2 and 3, the cover plate assembly preferably comprises a cover plate 20 having a layer of a shielding compound 22 applied thereto. The cover plate 20 is preferably comprised of a non-conductive, lightweight, impact-resistant stable material, for example a thermoset or thermoplastic compound. One type of plastic appropriate for the cover plate is a polyester such as Cyglas 605LS black, which is available from Cytec Industries, Inc., Perrysburg, Ohio. Cover plate 20 is preferably formed using conventional plastic-forming techniques known to those skilled in the art, for example, compression molding or injection molding the cover plate into an appropriate three-dimensional form to correspond to the dimensions of the underlying electronic product (or underlying housing portion). For example, the compression molding technique can include locating a sheet of uncured plastic material between two mold plates and applying appropriate temperature and compression to the plates while drawing a vacuum. In any case, the techniques for forming the cover plate are not part of the present invention.

Cover plate 20 includes an inner, substantially planar, major surface portion 24 and a plurality of walls or flanges which project outwardly from the surface at appropriate locations. For example, the cover plate can have walls 25 which extend around the periphery of the plate and define peripheral interface locations. Walls 25 are designed to be sealed against the periphery of the electronic product, or underlying housing portion, when the cover plate assembly is mounted to the electronic product for environmental sealing of the enclosure. An inwardly-facing shoulder 26 can be formed around the distal edge of walls 25 for reasons which will be described herein in more detail.

Cover plate 20 can also have interior walls 27 which are designed to be sealed against the upper surface of the electronic product when the cover plate assembly is mounted to the electronic product. Walls 27 form internal chambers for circuit-to-circuit shielding and define internal interface locations for thermal transfer from the electronic circuitry to ambient and from circuit-to-circuit. Cover plate 20 can also include internal walls 28 which extend only a short distance out from the cover plate and primarily provide support for the cover plate. The locations of walls 27, 28 is dictated by the shielding, thermal transfer and overall structural requirements for the cover plate and the electronic product. Walls 25, 27 and 28 typically have relatively flat sides which are slightly inwardly tapered. Walls 25 have substantially flat distal ends, while walls 27 and 28 can be slightly rounded. The walls, of course, can have any configuration depending upon the particular requirements of the cover plate and the electronic product. Moreover, the cover plate 20 could also be formed with only a planar surface portion without outwardly-extending walls or flanges, if the enclosure requirements so dictated.

The shielding compound 22 is preferably applied across the entire major surface portion 24 of cover plate 20. The shielding compound 22 can also be applied to the exterior surface of the cover plate if necessary, however, typically the exterior surface is bare or has only a layer of paint applied thereto. As shown in FIG. 3, the shielding compound 22 preferably extends in a relatively thin uniform layer of thickness "L" across the major surface of the cover. This layer is preferably from 0.020 to 0.040 inches (0.05 to 0.10 cm) thick, however, the thickness of this layer can vary depending upon the particular shielding requirements. Nevertheless, it is preferred that this layer be as thin as possible to reduce weight and material costs, while still providing shielding effectiveness over a broad frequency range.

The shielding compound also covers the outwardly-extending walls 25, 27 and 28. Preferably, the shielding compound is also applied in a relatively thin layer also of thickness "L" across the walls 28, that is, across the internal walls which only provide support for the cover plate. The shielding compound is preferably applied in a relatively thicker layer along the peripheral walls 25 anti internal walls 27 (or other locations on the cover plate 20) which define peripheral and internal interface locations, and in particular along the distal edges of these walls to seal against the electronic product or underlying housing portion. The shielding compound has a thickness at these locations which provides resilient, gasket-like characteristics at the interface locations when the cover plate is secured to the electronic product. For typical electronic enclosure applications, the thickness "T" of the shielding compound along the distal edges of wall 27 at the internal interface locations is preferably at least 0.125 inches (0.320 cm), and more preferably at least 0.250 inches (0.640 cm). The thickness "t" of the shielding compound along the distal edges of walls 25 is preferably at least 0.026 inches (0.067 cm). The shielding compound also fills the gap formed by shoulder 26 along the distal edges of walls 25 to provide an effective thickness along the distal edges of walls 25 of at least 0.224 inches (0.57 cm). The thickness of the compound along walls 25 and 27 can also vary depending upon the composition of the material, the width of the material, the space between the edge of the walls and the surface of the electronic product and/or the enclosure, and other criteria, as will be described herein in more detail. In any case, preferably the shielding compound is applied to walls 25 and 27 such that the distal edges of these walls are co-planar. When the shielding compound is applied in the foregoing manner, the shielding compound provides EMI/RFI shielding across the entire cover plate and between the internal chambers, as well as a resilient, gasket-like characteristics at the interface locations for environmental sealing, thermal transfer and shield continuity.

The shielding compound preferably comprises an elastomer with suspended conductive particles which can be easily deposited across the entire cover plate to provide EMI/RFI shielding capabilities, and resilient, gasket-like characteristics. The compound preferably provides shielding effectiveness of at least 50 db, and more preferably of at least 100 db, across a wide range of frequencies, and preferably across frequencies of up to at least 2.0 GHz when tested using conventional conductive compound test methods (e.g., MIL-STD-285). The compound also preferably has the following characteristics:

i) Shore A hardness of between 48 and 62 (and preferably 55)

ii) minimum tensile strength of 150 psi (10.2 atm), iii) maximum elongation of 400%, iv) minimum tear strength of 50 ppi (8.8 Kg/cm), v) maximum compression set of 23%, and vi) minimum compression deflection of 8%.

Such compound preferably has a stable, low water absorbing, and low-shrink elastomer base, e.g., silicon or fluorosilicon, with suspended conductive particles. Preferably, the metal particles are in powder, flake or fiber form, such as nickel fibers, however, they could also be in other forms, such as silver-plated glass spheres. Most preferably, the shielding compound is a nickel-coated, graphite-filled silicon elastomer available from the assignee of the present invention under the mark PARSHIELD. While this type of elastomer is most preferred, it is possible that other similar elastomeric compounds would be appropriate for the present invention if they provide the characteristics described above.

The cover plate assembly described above can have many applications for shielding electronic products. One particularly useful application is for providing EMI/RFI shielding, environmental sealing, thermal transfer and shield continuity for an electronics circuit board. The cover plate assembly encloses the circuitry on the circuit board to prevent exterior emissions or receipt of EMI/RFI, provides EMI/RFI circuit-to-circuit shielding, provides thermal transfer from the circuitry to ambient and between circuit-to-circuit, and provides environmental sealing of the entire enclosure. The cover plate assembly can be secured to the circuit board by providing tapped holes 32 (FIG. 2) at various locations around the walls or flanges 25, 27 or 28 of the cover plate to enable fasteners 33 such as screws or bolts to be inserted through holes 34 in the circuit board and then into the tapped holes in the cover plate. Appropriate flanges for the tapped holes can be formed in the cover plate during the initial molding process as should be apparent to those of ordinary skill in the art. The locations of the fasteners and holes can vary depending upon the particular application. Of course, other types of conventional fasteners can also be used to secure the cover plate assembly securely to the electronic product.

Preferably, the length of walls 25, 27 (which are sealed to the circuit board), and the thickness of the shielding compound along the distal edges of these walls, is chosen such that a compressive preload is applied against the circuit board. The necessary preload is determined based on such factors as the EMI/RFI shielding requirements for the circuitry, the anticipated unevenness of the circuit board, the maximum allowable deflection of the circuit board, and the thermal transfer and environmental sealing requirements for the circuitry. The compressive preload should not cause an unacceptable bending of the shielding compound nor deform the electrical product or alter its function. The type of material used for the shielding compound, the amount of material (thickness and width) at the interface locations, and the anticipated temperatures in the enclosure can also affect the desired amount of compression of the material. Compression is typically measured in terms of the squeeze of the material. The "squeeze" of the material is defined as the maximum amount of deflection divided by the over-all thickness of material. Preferably, for an electronics circuit board for a portable computer which can be up to 20/1000" out of flat, the squeeze on the enclosure and on the circuit board is in the range of 5–10% for a cross sectional gasket thickness of 0.296" at the interface locations for the preferred shielding compound described previously. The above amount of squeeze translates to about 5 lbs. per inch of preload against the circuit board.

Figure 4:
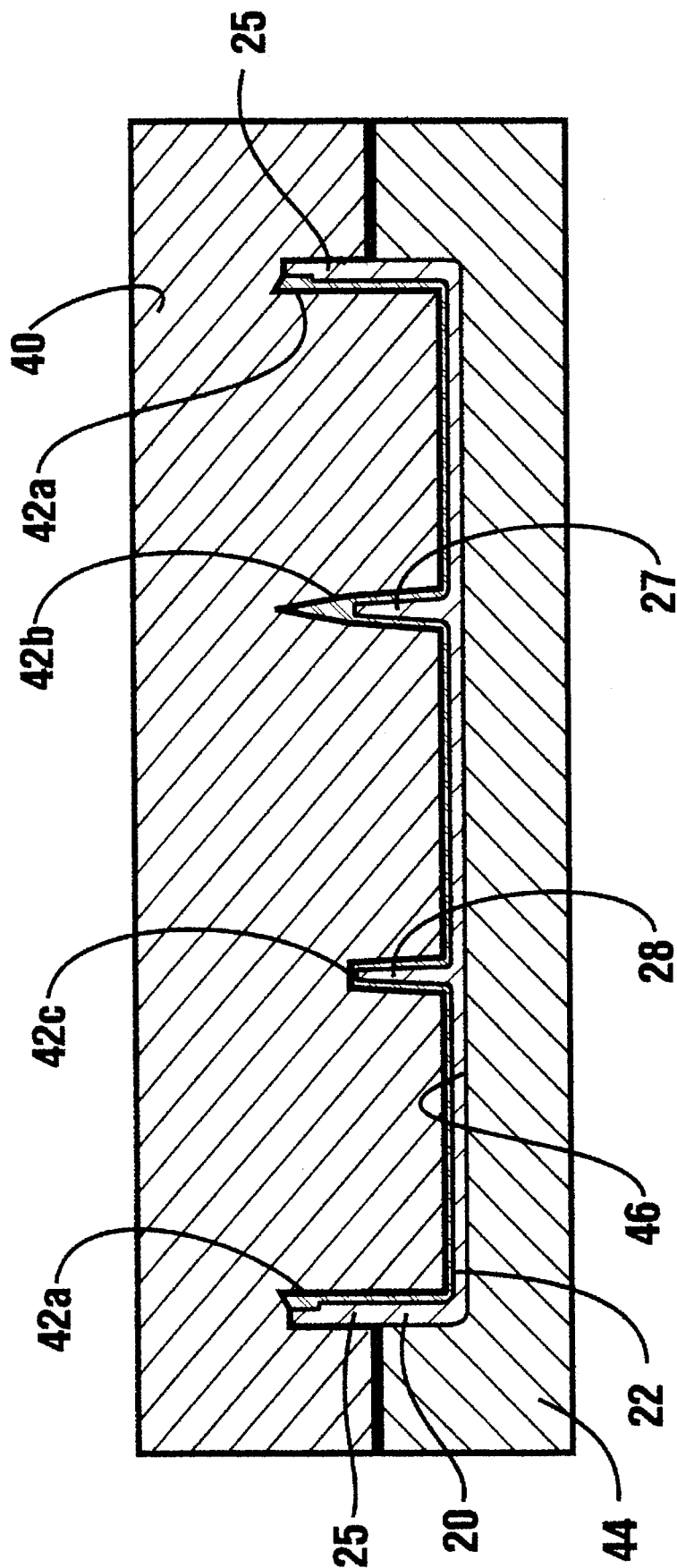
FIG. 4 is a cross-section side view of the cover plate assembly of FIG. 3 shown located between a pair of compression molding plates.

The shielding compound is also preferably a compound which can be easily formed (vulcanized) with the cover plate using conventional forming techniques. Preferably, the shielding compound is compression molded with the cover plate, although it could also be formed using other techniques such as injection molding. As shown in FIG. 4, for compression molding, one upper molding plate 40 is provided with channels and grooves 42a–42c on the inside surface, while a second lower molding plate 44 is provided with a flat opposing surface 46. The location for the channels 42a–42c in plate 40 corresponds to the locations of the walls 25, 27, 28 on the cover plate. Specifically, channel 42a corresponds to the location of wall 25; channel 42b corresponds to the location of wall 27; and channel 42c corresponds to the location of wall 28. The dimensions of the channel, and the distance between the mold plates, determines the thickness of the compound applied to the cover plate.

The cover plate 20 is located between the separated pair of heated molding plates with the walls on the cover plate being received within the channels on molding plate 40. The uncured shielding compound 22 is then introduced into the cavity between the molding plates. The shielding compound is preferably provided in a thin 0.07 inch (0.18 cm) sheet, or in injection molding form. A bonding agent (e.g., Chem-Lok®) can be applied between the cover plate and the shielding compound. Air pockets between the shielding compound and cover plate can be removed using a vacuum molding press. Compression forces are provided on the plates until the shielding compound completely fills the cavity between the plates.

Although the molding process can vary for the above-described preferred cover plate and shielding compound, a compression force of 500 psi (34 atm) for 5 minutes at 335° F. (168° C.) and with a vacuum applied between the plates has been found satisfactory to form the shielding compound with the cover plate described above. A post cure step where the shielding compound is baked at 300° F. (149° C.) for 8 hours can also be performed.

After the shielding compound is properly cured, the mold plates are removed and the assembly is allowed to cool.

Thus, as described above, the present invention provides a unique cover assembly for an electronics enclosure which provides EMI/RFI shielding across the entire cover plate and between the internal chambers, and has resilient gasket-like response at the interface locations between the cover plate assembly and the electronics enclosure or the electronic product for environmental sealing, thermal transfer and shield continuity. A single shielding compound can be used with the cover plate to reduce manufacturing complexity and costs.

The principles, preferred embodiments and modes of operation of the present invention have been described in the foregoing specification. The invention which is intended to be protected herein should not, however, be construed as limited to the particular form described as it is to be regarded as illustrative rather than restrictive. Variations and changes may be made by those skilled in the art without departing from the scope and spirit of the invention as set forth in the appended claims.

What is claimed is:

1. An EMI/RFI shielded cover assembly for an electronics enclosure, said cover assembly comprising a cover plate having a major surface area and interface locations for sealing against the electronics enclosure, and a shielding compound disposed in a layer across the major surface area and the interface locations on the cover plate, said shielding compound providing i) EMI/RFI shielding for said major surface area, and ii) resilient, gasket-like response at said interface locations to enable said cover assembly to be sealed to the electronics enclosure.

2. The assembly as in claim 1, wherein said shielding compound is applied in a relatively thin layer across the major surface area, and in a relatively thicker layer at the interface locations.

3. The assembly as in claim 1, wherein said cover plate includes a substantially planar surface portion and walls extending outwardly from said planar surface portion, said shielding compound being disposed along the distal edges of said walls.

4. The assembly as in claim 3, wherein said shielding compound is disposed in a thicker layer along the distal edges of the walls than along the major surface area.

5. The assembly as in claim 4, wherein said walls of said cover plate extend around the periphery of said cover plate and outwardly from the cover plate such that the shielding compound along the distal edges of the walls seals against the enclosure to provide an environmental seal for the enclosure.

6. The assembly as in claim 5, wherein said walls also extend outwardly from the cover plate at other locations around the cover plate to define internal chambers.

7. The assembly as in claim 1, wherein said cover plate is formed from plastic.

8. The assembly as in claim 1, further including a circuit board with electronic components disposed within the enclosure, said shielding compound providing EMI/RFI shielding for the electronic components on the circuit board.

9. The assembly as in claim 9, wherein said cover plate includes outwardly-extending walls, the distal edges of which are covered with said shielding compound, said walls extending outwardly to said circuit board such that said shielding compound along said distal edges is compressed against a surface of said circuit board to provide EMI/RFI shielding between portions of the electronic circuitry on the circuit board.

10. A process for forming an EMI/RFI shielded cover plate for an electronics enclosure, said cover plate having a major surface and interface locations for sealing against the electronics enclosure and said method comprising the steps of:

locating said cover plate against a heated mold plate, said mold plate having a surface configuration defining a cavity designed to correspond to desired thickness variations across said major surface and said interface locations of the cover plate, introducing between said major surface and said interface location of said cover plate and said surface of said mold plate a shielding compound comprising an elastomer with suspended conductive particles, and forming and curing said shielding compound between said cover plate and said mold plate such that said compound fills the cavity between the cover plate and said mold plate and is joined to said major surface and said interface locations of said cover plate in a layer with the desired thickness variation for providing i) EMI/RFI shielding for said major surface area, and ii) resilient, gasket-like response at said interface locations to enable said cover plate to be sealed to the electronics enclosure.

11. The method as in claim 10, wherein said compound is formed in a thin layer across said major surface of the cover plate, and in a thicker layer across said interface locations of the cover plate.

12. The method as in claim 10, wherein said cover plate includes a substantially planar surface portion and walls extending outwardly from said surface portion, said mold plate having grooves corresponding substantially to said walls on said cover plate, and said shielding compound is applied to said cover plate in a thinner layer across said substantially planar surface portion and in a thicker layer across distal edges of the walls of said cover plate.

13. The method as in claim 10, wherein said shielding compound is initially provided in sheet form when introduced into the cavity between the mold plates.

14. The method as in claim 10, wherein said shielding compound is vulcanized between said mold plates.

15. The method as in claim 10, wherein said cove plate is initially located between a pair of heated mold plates, said mold plates having opposing surface configurations defining the cavity corresponding to the desired thickness variation across the major surface and the interface locations of the cover plate.

16. An EMI/RFI shielded cover assembly for an electronics enclosure, said cover assembly comprising a cover plate having a major surface area and interface locations for sealing against the electronics enclosure, and a shielding compound disposed in a layer across the major surface area and the interface locations on the cover plate, said shielding compound comprising an elastomer with suspended conductive particles and providing i) EMI/RFI shielding for said major surface area, and ii) resilient, gasket-like response at said interface locations to enable said cover assembly to be sealed to the electronics enclosure.

17. The assembly as in claim 16, wherein said shielding compound provides EMI/RFI shielding of at least 50 db up to at least 2 GHz.

18. The assembly as in claim 17, wherein said shielding compound is a nickel-coated graphite-filled silicon elastomer.

19. A method of shielding an electronics enclosure from electromagnetic interference (EMI) and radio frequency interference (RFI) comprising the steps of:

a) providing a cover plate having a major surface area and interface locations sealable against the electronics enclosure, b) disposing a layer of a resilient shielding compound across the major surface area and the interface locations of the cover plate, and c) covering the electronics enclosure with the cover plate, said layer of said shielding compound providing EMI/RFI shielding for the major surface area of the cover plate and sealing the interface locations thereof against the electronics enclosure.

20. The method as in claim 19, wherein said shielding compound comprises an elastomer which is filled with electrically-conductive particles.

* * * * *

UNITED STATES PATENT AND TRADEMARK OFFICE
CERTIFICATE OF CORRECTION

PATENT NO. : 5,566,055
DATED : October 15, 1996
INVENTOR(S) : Joseph A. Salvi, Jr.

It is certified that error appears in the above-indentified patent and that said Letters Patent is hereby corrected as shown below:

On the title page:Item [54] and Column 1, line 1,

Title of invention should read;

SHIELDED ENCLOSURE FOR ELECTRONICS

Signed and Sealed this

Seventh Day of January, 1997

Attest:

BRUCE LEHMAN

*Attesting Officer*                    Commissioner of Patents and Trademarks